(12) United States Patent
Milas et al.

(10) Patent No.: US 8,497,487 B2
(45) Date of Patent: *Jul. 30, 2013

(54) SAMPLE HOLDER WITH OPTICAL FEATURES

(75) Inventors: Mirko Milas, Baden (CH); Yimei Zhu, Stony Brook, NY (US); Jonathan David Rameau, Coram, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/398,623

(22) Filed: Feb. 16, 2012

(65) Prior Publication Data

US 2012/0145897 A1    Jun. 14, 2012

Related U.S. Application Data

(63) Continuation of application No. 12/582,149, filed on Oct. 20, 2009, now Pat. No. 8,143,593.

(60) Provisional application No. 61/106,637, filed on Oct. 20, 2008.

(51) Int. Cl.
*G21K 5/08* (2006.01)
*H01J 37/20* (2006.01)

(52) U.S. Cl.
USPC .................................. 250/440.11

(58) Field of Classification Search
USPC ........................ 250/440.11–443.1
See application file for complete search history.

(56) References Cited

U.S. PATENT DOCUMENTS

| | | | |
|---|---|---|---|
| 6,576,910 B2 | 6/2003 | Hashikawa et al. | |
| 7,115,882 B2 * | 10/2006 | Moore | 250/440.11 |
| 7,126,133 B2 | 10/2006 | Moore | |
| 7,268,356 B2 | 9/2007 | Schichi et al. | |
| 7,315,023 B2 | 1/2008 | Moore | |
| 7,375,325 B2 * | 5/2008 | Burkhardt et al. | 250/307 |
| 8,143,593 B2 * | 3/2012 | Milas et al. | 250/440.11 |
| 2005/0035302 A1 * | 2/2005 | Morrison | 250/442.11 |
| 2008/0283748 A1 * | 11/2008 | Matsumoto et al. | 250/311 |

OTHER PUBLICATIONS

Abraham et al., "Teflon Feedthrough for Coupling Optical Fibers Into Ultrahigh Vacuum Systems," Applied Optics, vol. 37, No. 10, pp. 1762-1763 (Apr. 1, 1998).

* cited by examiner

*Primary Examiner* — Robert Kim
*Assistant Examiner* — David E Smith
(74) *Attorney, Agent, or Firm* — Dorene M. Price

(57) ABSTRACT

A sample holder for holding a sample to be observed for research purposes, particularly in a transmission electron microscope (TEM), generally includes an external alignment part for directing a light beam in a predetermined beam direction, a sample holder body in optical communication with the external alignment part and a sample support member disposed at a distal end of the sample holder body opposite the external alignment part for holding a sample to be analyzed. The sample holder body defines an internal conduit for the light beam and the sample support member includes a light beam positioner for directing the light beam between the sample holder body and the sample held by the sample support member.

20 Claims, 13 Drawing Sheets

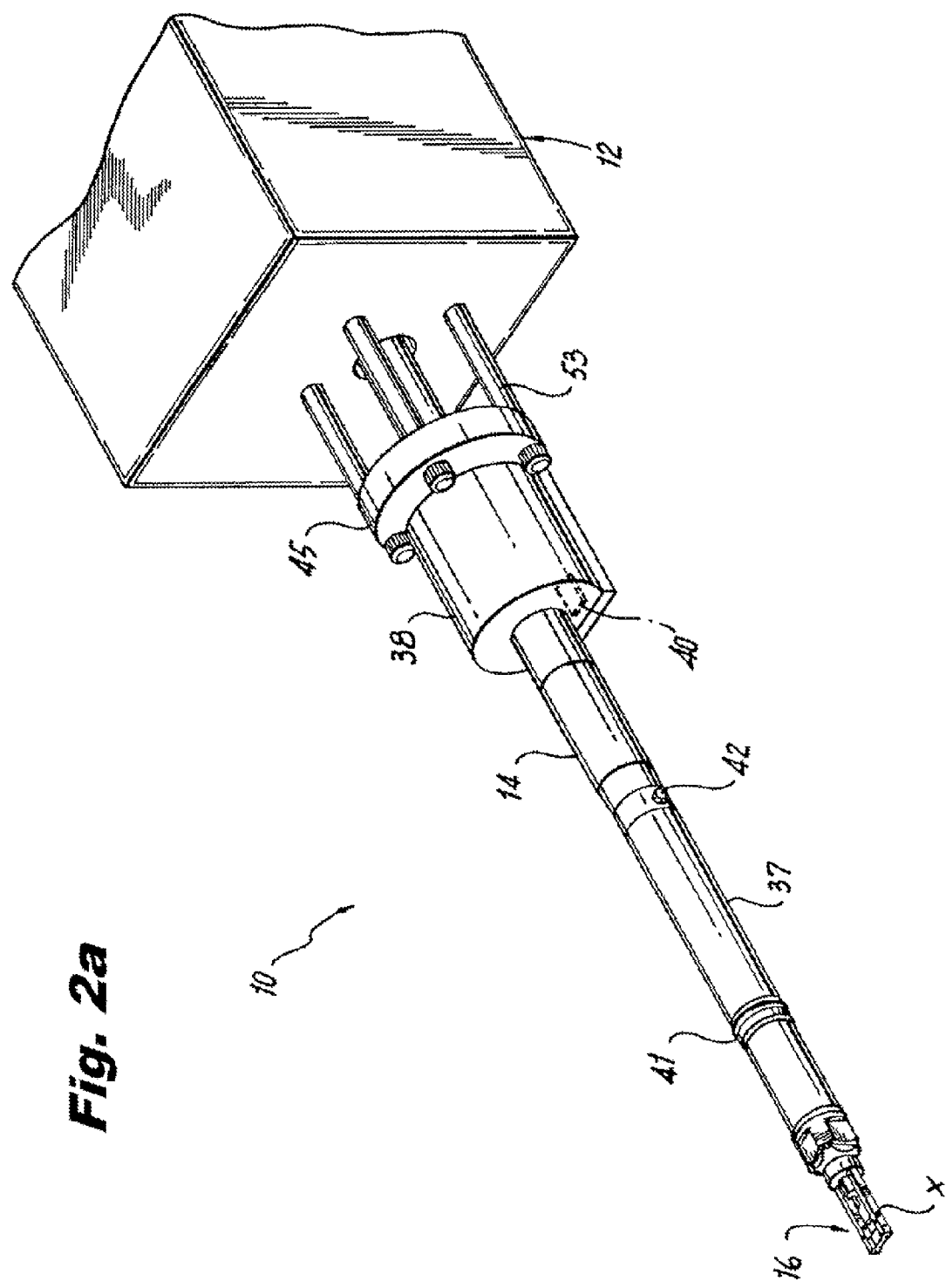

SAMPLE HOLDER WITH OPTICAL FEATURES

CROSS-REFERENCE TO RELATED APPLICATIONS

This application is a continuation application of U.S. application Ser. No. 12/582,149, filed on Oct. 20, 2009 now U.S. Pat. No. 8,143,593, which claims the benefit of U.S. Provisional Application No. 61/106,637, filed on Oct. 20, 2008, the specification of which is incorporated by reference herein in their entirety for all purposes.

This invention was made with Government support under contract number DE-ACO2-98CH10886, awarded by the U.S. Department of Energy. The Government has certain rights in the invention.

BACKGROUND OF THE INVENTION

The present invention relates to a sample holder for holding a sample to be observed for research purposes, and more particularly to a sample holder for holding a sample to be observed in an electron microscope, such as a transmission electron microscope (TEM), and which has the capability of delivering and accurately directing a light beam to the sample held by the sample holder and/or collect a light beam and transport it outside the TEM for analysis.

Structural evaluation using an electron microscope has been conventionally employed as one of the methods for examining and evaluating samples in the fields of micro- and nanotechnology. The electron microscopes used in these fields mainly include the scanning electron microscopes (SEM) and the transmission electron microscopes (TEM). In the SEM, a beam of electrons is applied to a cleavage plane or an FIB (Focused Ion Beam) processed plane of the sample being observed (observed sample) and secondary electrons etc. obtained from the sample form an image for observation.

In the TEM, a beam of electrons is transmitted through a very thin, (e.g., 1 μm thick or less), observed sample and transmitted electrons and scattered electrons (e.g., elastically scattered electrons) form an image for observation of the internal structure of the sample. The image formed from the electrons transmitted through the specimen is typically magnified and focused by an objective lens and appears on an imaging screen, (i.e., a fluorescent screen in most TEMs), plus a monitor, or on a layer of photographic film, or to be detected by a sensor such as a CCD camera.

Modern TEMs are often equipped with specimen holders that allow the user to tilt the specimen to a range of angles in order to obtain specific diffraction conditions, and apertures placed above the specimen allow the user to select electrons that would otherwise be diffracted in a particular direction from entering the specimen. By carefully selecting the orientation of the sample, it is possible not just to determine the position of defects but also to determine the type of defect present. If the sample is orientated so that one particular plane is only slightly tilted away from the strongest diffracting angle (known as the Bragg Angle), any distortion of the crystal plane that locally tilts the plane to the Bragg angle will produce particularly strong contrast variations. However, defects that produce only displacement of atoms that do not tilt the crystal to the Bragg angle (i.e. displacements parallel to the crystal plane) will not produce strong contrast.

The TEM is used heavily in both material science/metallurgy and the biological sciences. In both cases the specimens must be very thin and able to withstand the high vacuum present inside the instrument. For biological specimens, the maximum specimen thickness is roughly 1 micrometer. To withstand the instrument vacuum, biological specimens are typically held at liquid nitrogen temperatures after embedding in vitreous ice, or fixated using a negative staining material such as uranyl acetate or by plastic embedding. Typical biological applications include tomographic reconstructions of small cells or thin sections of larger cells and 3-D reconstructions of individual molecules via Single Particle Reconstruction.

In material science/metallurgy the specimens tend to be naturally resistant to vacuum, but must be prepared as a thin foil, or etched so some portion of the specimen is thin enough for the beam to penetrate. Preparation techniques to obtain an electron transparent region include ion beam milling and wedge polishing. The focused ion beam (FIB) is a relatively new technique to prepare thin samples for TEM examination from larger specimens. Because the FIB can be used to micromachine samples very precisely, it is possible to mill very thin membranes from a specific area of a sample, such as a semiconductor or metal. Materials that have dimensions small enough to be electron transparent, such as powders or nanotubes, can be quickly produced by the deposition of a dilute sample containing the specimen onto support grids. The suspension is normally a volatile solvent, such as ethanol, ensuring that the solvent rapidly evaporates allowing a sample that can be rapidly analyzed.

In certain applications, analysis of a sample subjected to light is desirable. Specifically, it is often desirable to analyze the optical properties of a sample under light conditions within a TEM. In this regard, attempts have been made to modify conventional TEMs by providing a window to the TEM housing to allow light from an external source to enter the interior chamber of the TEM in the area of the sample. Thus, prior solutions have involved modifications of the TEM column to provide an optical path to the sample position. As can be appreciated, such solutions are very complicated and expensive and involve major modifications of the microscope column.

SUMMARY OF THE INVENTION

Recognizing that it would be desirable to provide a sample holder for use in a TEM that also has the capability of accurately delivering a precise, predetermined light beam directly to a sample held by the holder in order to analyze the optical properties of the sample under light conditions within the TEM, in some embodiments the present invention provides sample holder for holding a sample to be observed for research purposes, particularly in a transmission electron microscope (TEM). The sample holder generally includes an external alignment part for directing a light beam in a predetermined beam direction, a sample holder body in optical communication with the external alignment part and a sample support member disposed at a distal end of the sample holder body opposite the external alignment part for holding a sample to be analyzed. The sample holder body defines an internal conduit for the light beam and the sample support member includes a light beam positioner for directing the light beam between the sample holder body and the sample held by the sample support member.

In a preferred embodiment, the sample support member further includes a second light beam positioner, wherein the first light beam positioner delivers the light beam from the sample holder body to the sample held by the sample support member and the second light beam positioner collects the light beam from the sample and delivers the light beam to the sample holder body.

Each of the first and second light positioners is preferably a light deflection assembly for deflecting the light beam to and/or from the sample held by the sample support member. The light deflection assembly preferably includes a mirror support, a mirror disposed at a distal end of the mirror support, a first adjustment mechanism provided at a proximal end of the mirror support opposite the mirror for positioning the mirror in a first direction, a second adjustment mechanism engaged with the mirror support for positioning the mirror in a second direction and a third adjustment mechanism engaged with the mirror support for positioning the mirror in a third direction.

The sample support member preferably has a U-shaped body including parallel legs joined by a cross member. The legs are fixed to the sample holder body and at least one of the legs has an axial bore communicating with the internal conduit of the sample holder body for conveying the light beam between the sample holder body and the sample. In this case, the leg having the axial bore also has a transverse window communicating with the axial bore in the leg, and the first light positioner is a light deflection assembly disposed in the axial bore of the leg adjacent the window for deflecting the light beam between the leg axial bore and the sample through the window.

The light beam can be conveyed through the sample holder body via one or more optical fibers disposed within the internal conduit of the sample holder body. Where optical fibers are used, the light beam positioner can be in the form of a support platform for retaining the optical fiber, wherein the support platform is adjustable with respect to the sample support member for directing the light beam to and/or from the sample.

The present invention may further involve a method for providing light to a sample held by a sample holder within a transmission electron microscope (TEM). The method generally includes the steps of conveying a light beam through an internal conduit of a sample holder body of the sample holder, holding the sample at a distal end of the sample holder body with a sample support member fixed to the distal end of the sample holder body and directing the light beam between the sample holder body and the sample with a first light beam positioner of the sample support member.

In one embodiment of the method, the light beam travels from the sample holder body and is deflected by the first light positioner toward the sample. In this embodiment, the light beam may further be caused to travel from the sample and be deflected back to the sample holder body by a second light positioner of the sample support member. Alternatively, the light beam may be made to travel from the sample and be deflected by the first light positioner into the sample holder body.

The method may further include the step of directing a second light beam between the sample holder body and the sample with a second light positioner of the sample support member. Also, the light beam may be conveyed through the sample holder body via an optic fiber disposed within the internal conduit of the sample holder body.

In any case, the sample holder of the present invention is particularly suited for use in an electron microscope, such as a transmission electron microscope (TEM) and has the capability of delivering and accurately directing a light beam to the sample held by the sample holder.

A preferred form of the sample holder, as well as other embodiments, objects, features and advantages of this invention, will be apparent from the following detailed description of illustrative embodiments thereof, which is to be read in conjunction with the accompanying drawings.

BRIEF DESCRIPTION OF THE DRAWINGS

FIG. 2a is a top perspective view of a sample holder of the present invention with a stand-off mounted between the sample holder body and the external alignment part.

DETAILED DESCRIPTION OF THE PREFERRED EMBODIMENT

Figure 1:
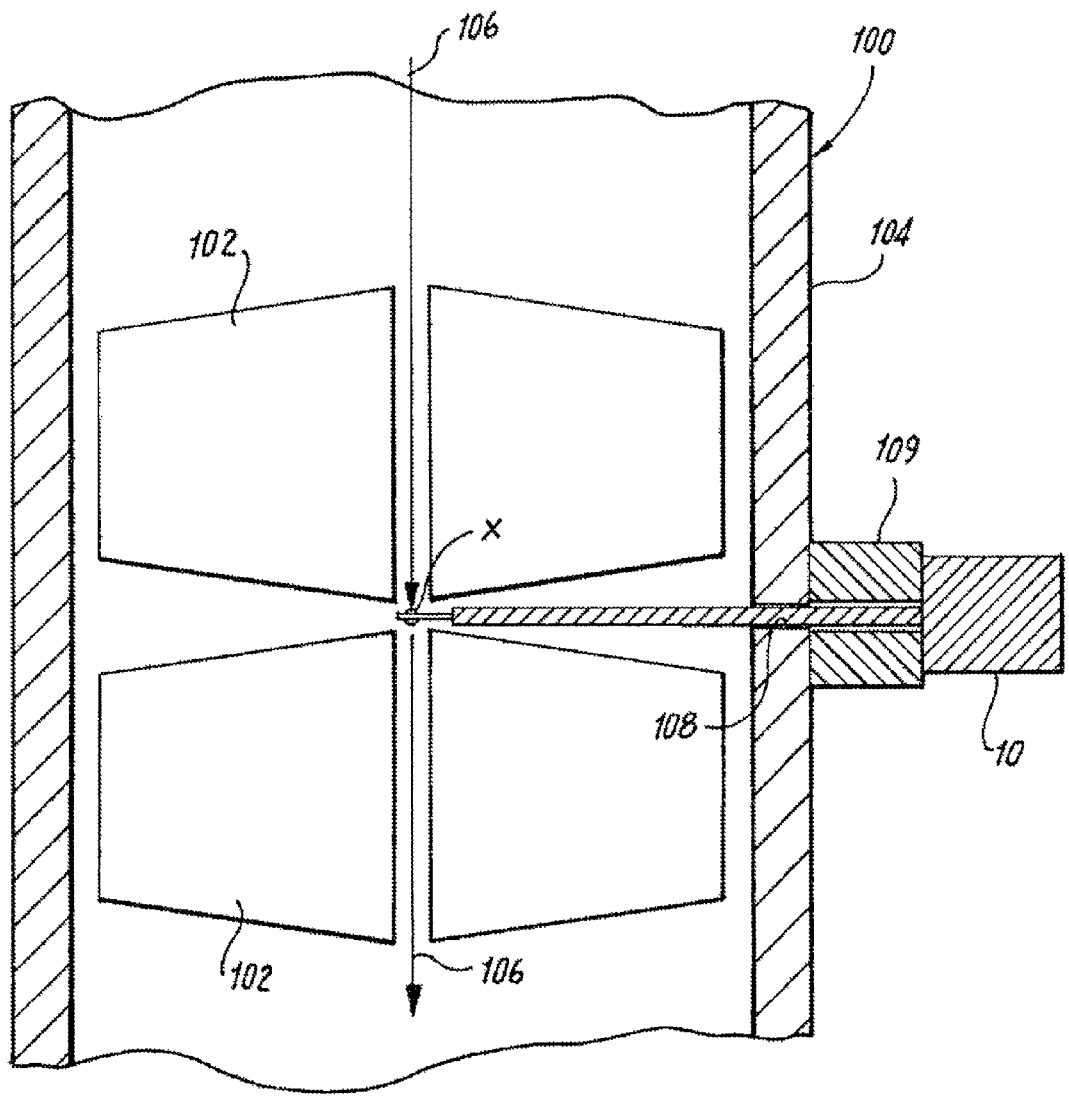
FIG. 1 is a schematic cross-sectional view of a conventional transmission electron microscope (TEM) having a sample holder formed in accordance with the present invention inserted therein.

Referring first to FIG. 1, a sample holder 10 of the present invention is shown in schematic form in use with a conventional transmission electron microscope (TEM) 100. As is known in the art, the TEM typically includes an arrangement of electromagnetic lenses 102 contained within a housing 104 for directing and focusing a beam of electrons 106 through a sample X to be analyzed. Not shown in FIG. 1 is the source of electrons provided upstream of the sample X, or the detector provided downstream of the sample X for detecting the resultant interaction of the electrons with the sample.

The housing 104 of the TEM 100 typically further includes a portal 108 through which the sample holder 10 can be inserted to position the sample X within the electron beam path 106. A goniometer stage 109 is typically provided at the portal 108 to facilitate precise positioning of the sample holder 10. The goniometer stage 109 includes appropriate interfacial structure, such as O-rings and valves to maintain a vacuum inside the TEM housing 104 with the sample holder inserted therein. The goniometer stage 109 further includes adjustment mechanisms to finely position the sample holder 10 once it is in the beam path. It also provides one rotational degree of freedom (around the axis) that can tilt the sample.

As discussed above, conventional TEM sample holders typically consist of only a probe terminating at a tip and having means for supporting a sample at the end of the probe.

Some sample holders, themselves, further include adjustment means for accurately positioning the sample within the TEM.

Figure 2:
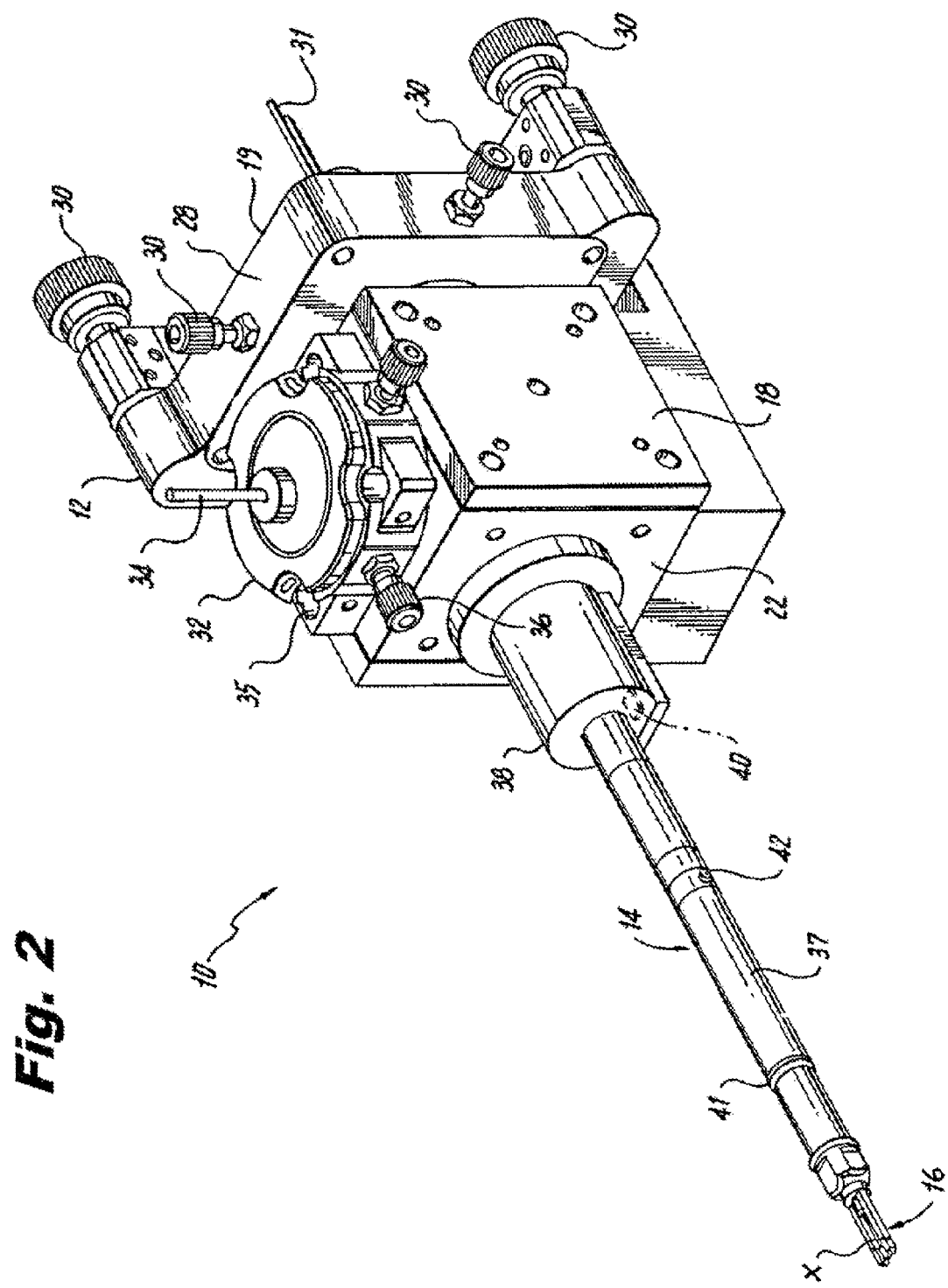
FIG. 2 is a top perspective view of a sample holder of the present invention.

Turning now to FIG. 2, an exemplary TEM sample holder 10 of the present invention is shown. The sample holder 10 generally includes an external alignment part 12, a sample holder body 14 extending out from the external alignment part and a sample support member 16 disposed at the end of the sample holder body opposite the external alignment part. In general, the external alignment part 12 is designed to accurately deliver a light beam into the sample holder body 14 and the sample support member 16 is designed to support a sample, while simultaneously directing the light beam to the sample. As will be discussed in further detail below, the sample support member 16 is further preferably designed to redirect the light beam back into the sample holder body 14 to be received by the external alignment part 12.

Figure 3:
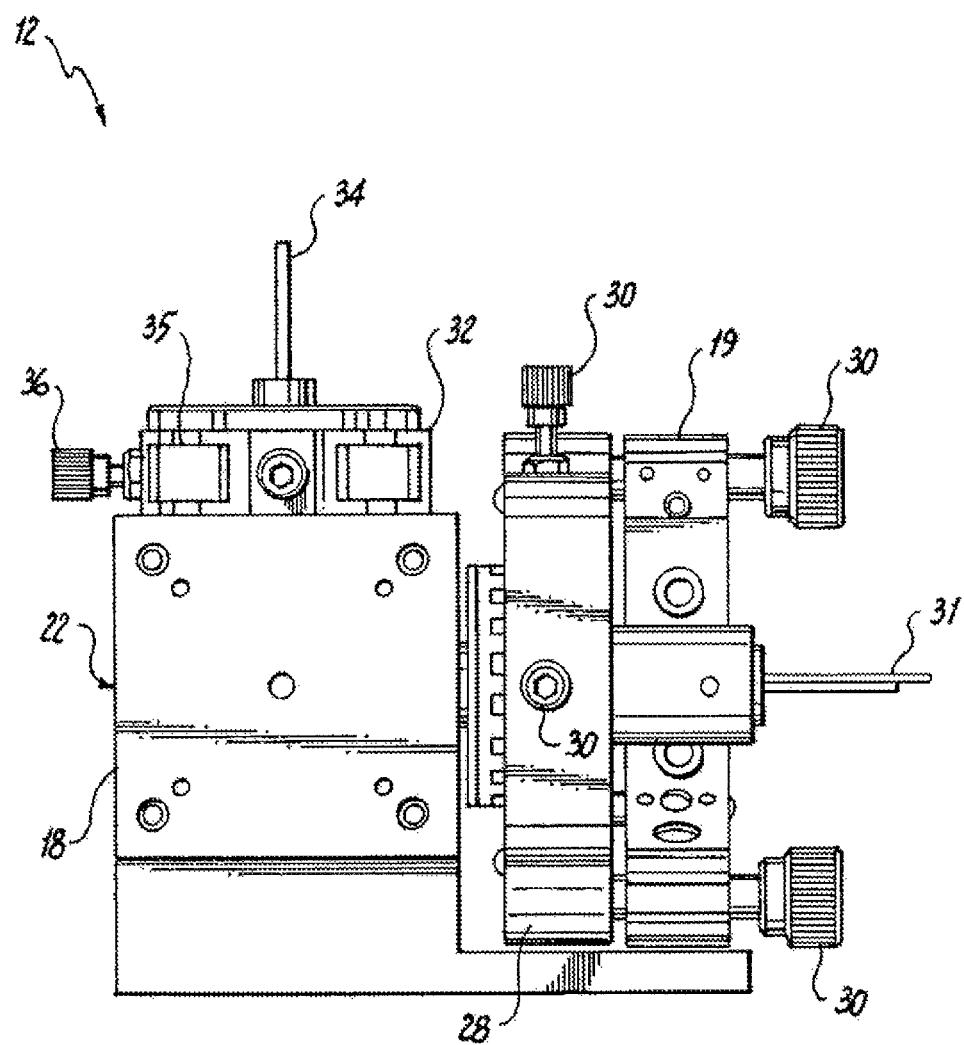
FIG. 3 is a side view of the external alignment part of the sample holder shown in FIG. 2.
Figure 4:
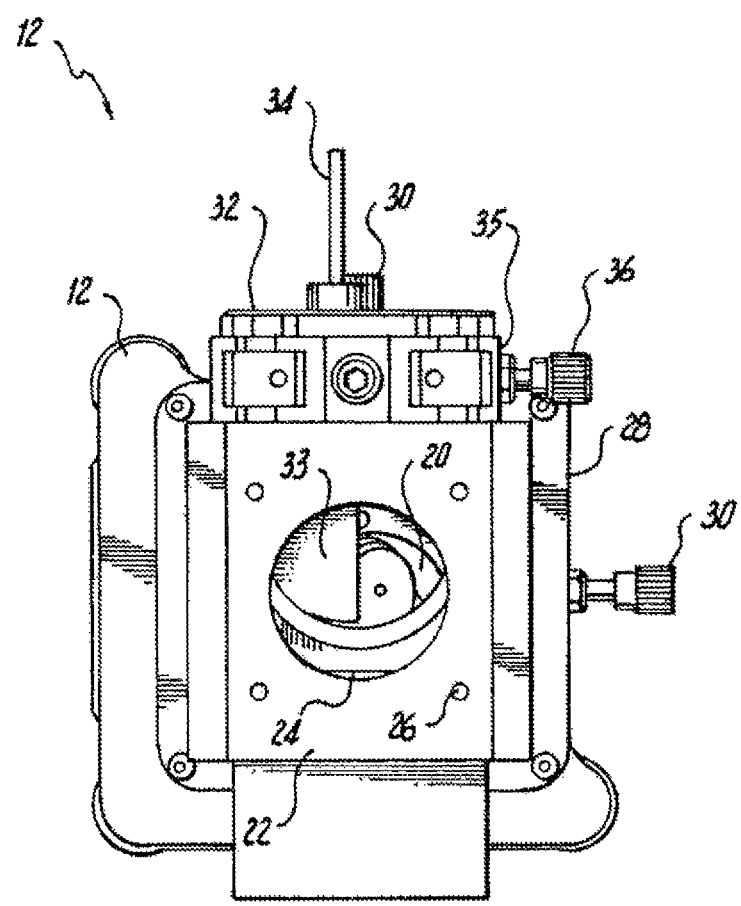
FIG. 4 is a front view of the external alignment part of the sample holder shown in FIGS. 2 and 3.

Referring additionally to FIGS. 3 and 4, the external alignment part 12 is adapted to interface with a light source, such as a laser (not shown) and is further preferably adapted to interface with a light detector (not shown). In this regard, the external alignment part 12 generally includes a housing 18 and a light source interface assembly 19 attached to one end of the housing. The housing 18 defines an interior 20, through which a light beam from a light source travels. The housing 18 further includes a sample holder body mounting surface 22 opposite the light source interface assembly 19 for mounting the sample holder body 14 thereto. The sample holder body mounting surface 22 has an opening 24 communicating with the interior 20 of the housing 18. The mounting surface 22 may also include apertures 26 to facilitate mounting of the sample holder body 14 to the mounting surface 22.

The light source interface assembly 19 is adapted to engage a light source and deliver a light beam from the light source into the interior 20 of the housing 18. The light source interface assembly 19 preferably includes a positioning stage 28 having adjustment and alignment mechanisms 30 with at least four degrees of freedom (two translations and two rotations) to accurately deliver a laser beam, for example, from the light source into the interior 20 of the housing 18. The light beam can be transmitted by an optical fiber 31, or can be directly emitted from a mounted laser source connected to the positioning stage 28 for accurately aiming and aligning the laser or highly collimated light beam into the sample holder body 14. The positioning stage 28 is preferably designed to accurately micro-position the light beam in the X, Y, and Z directions, plus three rotational degrees of freedom via the adjustment mechanisms 30.

As mentioned above, the external alignment part 12 is further preferably adapted to receive a returning light beam from the sample holder body 14 and direct the received light beam to a light detector optically connected to the external alignment part. As such, the external alignment part 12 further preferably includes a mirror 33 positioned within the interior 20 of the housing 18 to deflect a light beam received from the sample holder body 14 ninety degrees to a detector interface 32. The detector interface 32 is disposed on the housing 18 in a perpendicular fashion with respect to the light source interface 19 to receive the light beam deflected by the housing mirror 38. Like the light source interface 19, the detector interface 32 preferably includes an optical fiber 34 coupled to a focusing lens and connected to a positioning stage 35 capable of being aligned in two degrees of freedom (in-plane translation and one rotation) via an arrangement of adjustment mechanisms 36 for accurately aligning a received laser beam from the sample holder body 14.

In operation, a light beam from the light source is received by the light source interface 19 and is directed through the opening 24 of the sample holder body interface 22 into the sample holder body 14. The light beam travels the length of the sample holder body 14 and, as will be discussed in further detail below, is accurately delivered to a sample X held by the sample support member 16. As will be also discussed in further detail below, the sample support member 16 preferably reflects the beam back through the sample holder body 14 and back into the interior 20 of the external alignment part 12 through the opening 24 of the housing 18. The mirror 38 positioned within the interior 20 of the housing 18 deflects the returning light beam toward the detector interface 32, where the beam is collected and delivered to a detector for analysis.

Figure 5A:
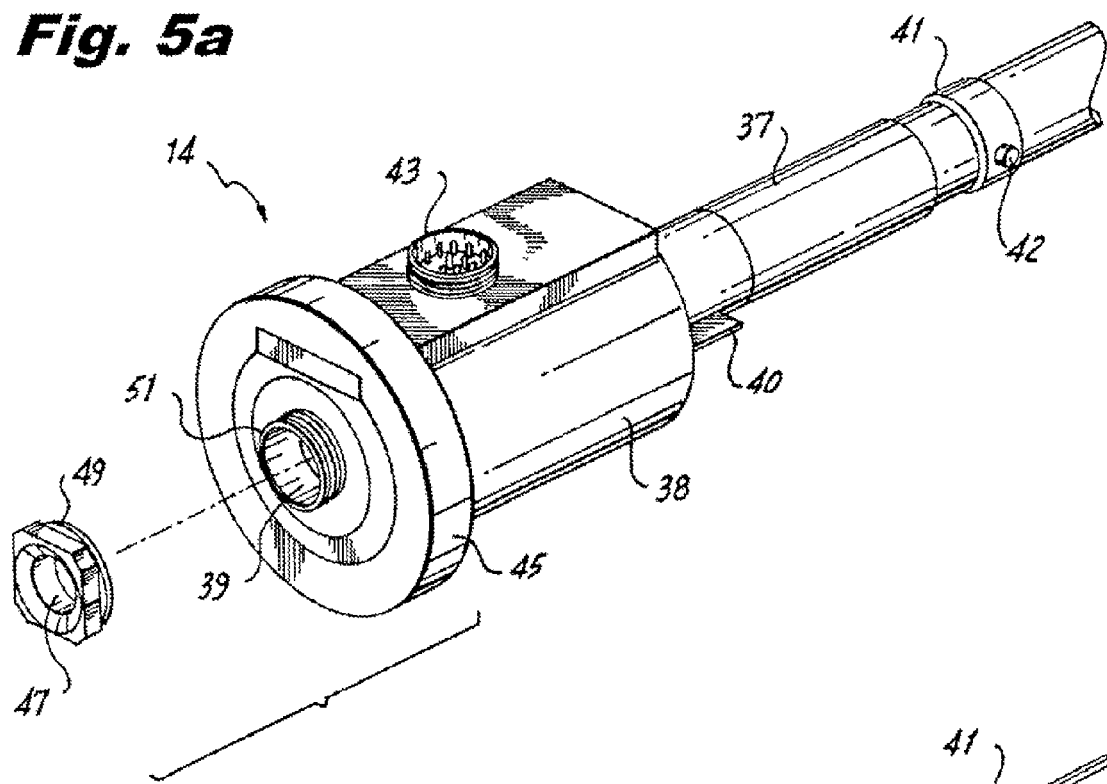
FIGS. 5a and 5b are top perspective views showing alternative embodiments of the interface between the sample holder body and the external alignment part.
Figure 5B:
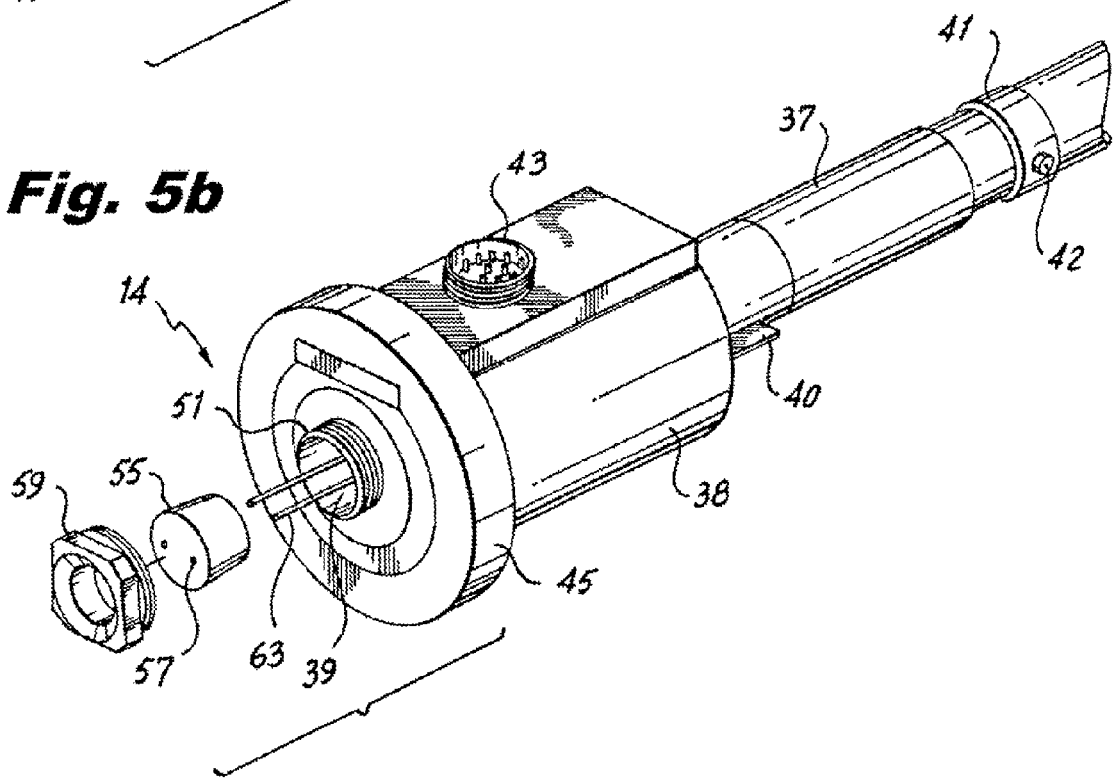

Thus, the sample holder body 14 essentially serves as a conduit for the light beam traveling between the external alignment part 12 and the sample support member 16. Referring now to FIGS. 5a and 5b, the sample holder body 14 is generally a tubular member and includes a probe portion 37 extending axially outward from a radially enlarged shoulder portion 38. The probe portion 37 and the shoulder portion 38 can be specifically designed and manufactured in terms of size and shape to be accommodated within the dimensions of a particular TEM.

The probe portion 37 and the shoulder portion 38 can take the form of a hollow tube having a large singular central bore 39 extending the entire length of the sample holder body 14 to provide a clear optical path for the light beam. Such bore 39 can also be made large enough to accommodate one or more auxiliary devices, such as a STM tip, within the sample holder body 14, as will be discussed in further detail below. Alternatively, the probe portion 37 and the shoulder portion can be made more solid, whereby only two reduced diameter light beam conduits are formed axially therein.

The shoulder 38 of the sample holder body 14 is designed to engage the portal 108 of the TEM housing 104 and may include one or more alignment tabs 40 to facilitate accurate positioning of the sample holder body within the TEM housing. Various O-ring seals 41 and additional alignment pins 42 may also be provided at select locations along the length of the probe portion 37 in order to respectively maintain a vacuum and align the probe portion within the TEM 100 when the sample holder 10 is inserted therein. The shoulder 38 may also include one or more electrical contacts 43 for providing electrical and/or data communication with an auxiliary device contained within the probe portion 37 of the sample holder body 14.

The bore 39 of the sample holder body 14 terminates at a proximal end 45 of the shoulder portion 38 opposite the probe portion 37. The proximal end 45 of the shoulder portion 38 is designed to be mounted to the sample holder body interface surface 22 of the external alignment part 12 so that the bore 39 of the sample holder body 14 is in optical communication with the interior 20 of the external alignment part housing 18.

The proximal end 45 of the shoulder portion 38 can be mounted directly to the sample holder body interface surface 22, as shown in FIG. 2, or a stand-off assembly 53 can be provided between the proximal end 45 of the shoulder portion 38 and the sample holder body interface surface 22 of the housing 18 so that a space is formed between the sample holder body 14 and the external alignment part 12, as shown in FIG. 2a. Such space may be desirable in certain applications for viewing and measuring the light beam as it passes between the external alignment part and the sample holder body. The stand-off assembly may simply consist of a plurality of spacer bars mounted between the proximal end 45 of the shoulder portion 38 and the sample holder body interface surface 22 of the housing 18.

In any event, it is preferable that a vacuum be maintained within the bore 39 of the sample holder body 14 when the body is mounted to the external alignment part 12. Accordingly, there are several options contemplated by the present invention for sealing the bore 39 from the environment while permitting a light beam to enter the bore.

In a preferred embodiment, as shown in FIG. 5a, a transparent window 47 is provided to seal the bore 39 yet allow a light beam to enter the bore of the sample holder body 14. The window 47, which can be made of glass or quartz, can be incorporated in an internally threaded cap 49, for example, which can be twisted on an externally threaded boss 51 formed on the proximal end 45 of the shoulder portion 38. An O-ring (not shown), or some other form of vacuum sealant, is further preferably provided between the internally threaded cap and the externally threaded boss 51 to facilitate a good vacuum connection therebetween. Such design allows a light beam to enter and exit the sample holder body 14 through the window while maintaining a vacuum within the bore 39.

In an alternative embodiment, as shown in FIG. 5b, optical fibers 63 are provided in the bore 39 of the sample holder body 14. In this design, the fibers 63 are fed through a ferrule 55 having passages 57 formed therein, for receiving the fibers in a sealing manner. The ferrule 55 is preferably made from Teflon and further has an outer diameter sized to seal the bore 39 of the sample holder body 14. The ferrule 55 can be retained in the bore 39 of the sample holder body 14 by an internally threaded cap 59, for example, which, again, can be twisted on an externally threaded boss 51 formed on the proximal end 45 of the shoulder portion 38. An example of an optical fiber coupling suitable for use with the present invention is shown and described in Abraham et al., "Teflon Feedthrough For Coupling Optical Fibers Into Ultrahigh Vacuum Systems," *Applied Optics*, Vol. 37, No. 10, pp. 1762-1763 (Apr. 1, 1988), which is incorporated herein by reference in its entirety.

Figure 6:
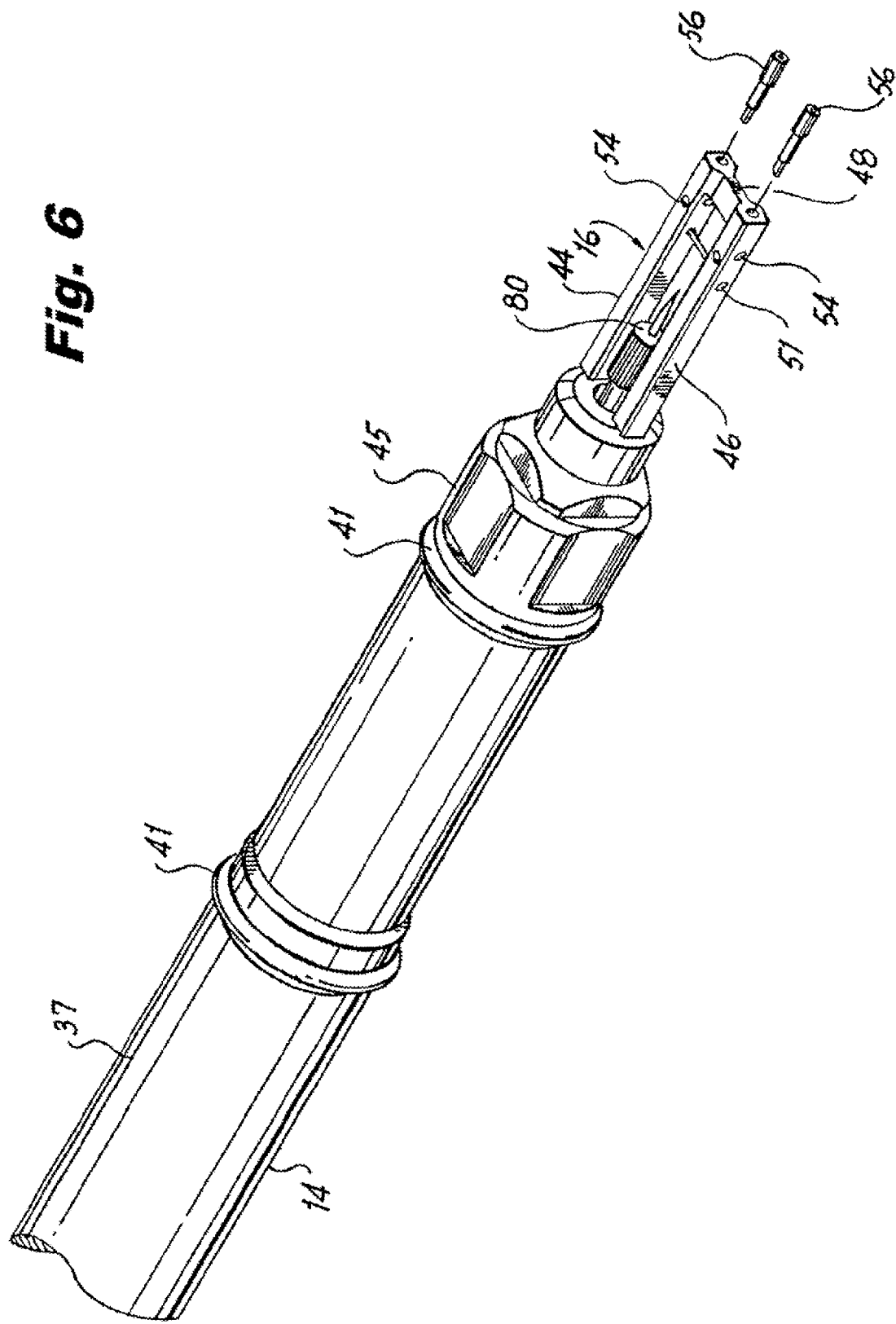
FIG. 6 is an enlarged perspective view of the sample holder body and the sample support member of the sample holder shown in FIG. 2.
Figure 7:
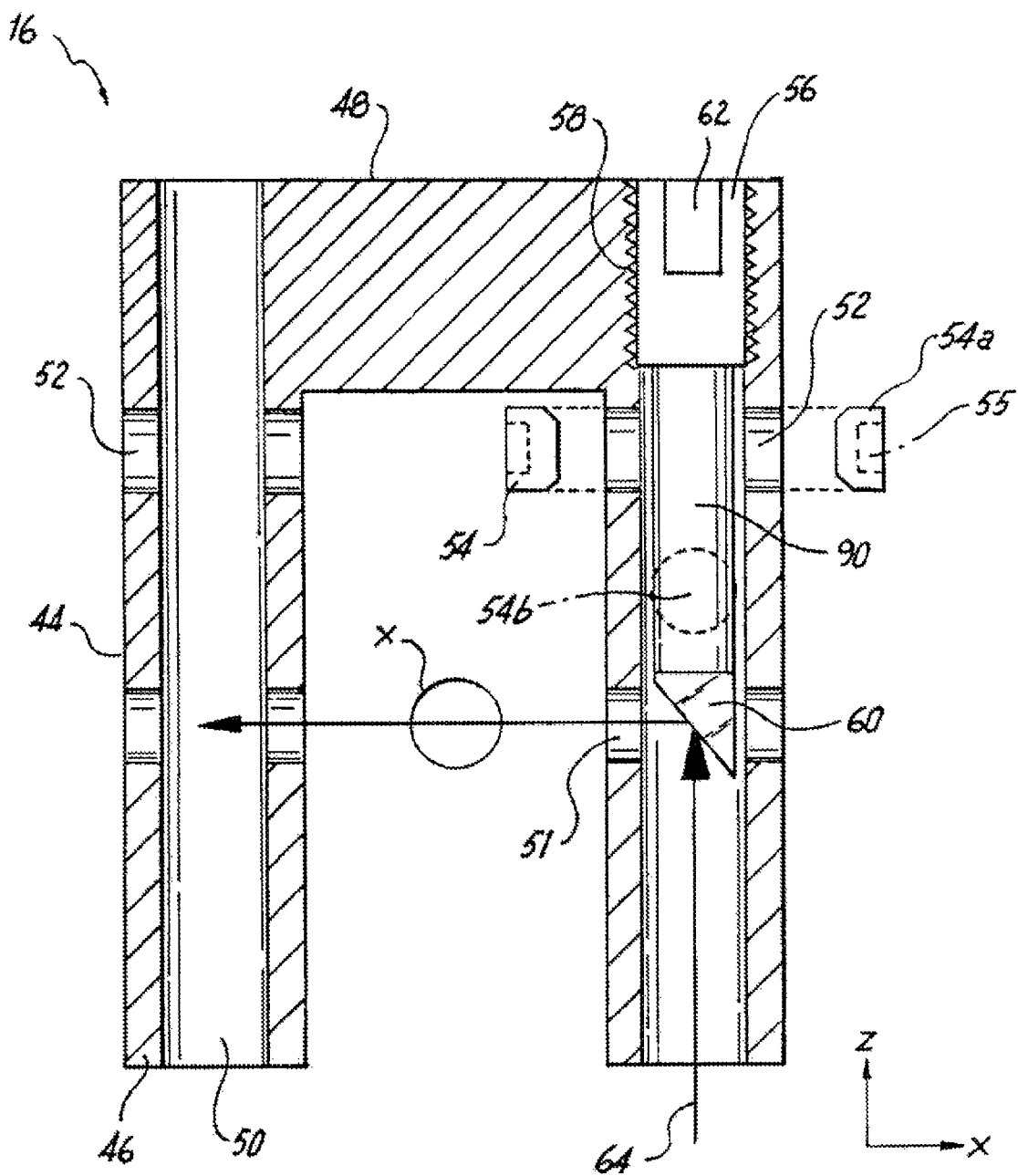
FIG. 7 is a cross-sectional view of the sample support member of the sample holder.

Turning now to FIGS. 6 and 7, disposed at the distal end of the sample holder body 14 opposite the shoulder portion 38, is the sample support member 16. The member 16 includes a U-shaped body 44 having parallel legs 46 joined by a cross member 48. The ends of the parallel legs 46 opposite the cross member 48 are fixed to the distal end of the sample holder body 14 and communicate with the axial bore 39 of the probe portion of the body. A fitting 49 of suitable design can be utilized to facilitate attachment of the U-shaped body 44 to the sample holder body 14.

In a preferred embodiment, each leg 46 of the U-shaped body 44 has a bore 50 formed therein. The bore 50 extends along the entire length of the leg 46 and communicates with the axial bore 39 of the sample holder body 14. Each leg 46 further preferably includes a pair of transverse optical windows 51 and a plurality of threaded transverse apertures 52 communicating with the central bore 50. The axial center line of the optical windows 51 and the threaded transverse apertures 52 are perpendicular to the axial center line of the leg axial bores 50. As will be discussed in further detail below, the optical windows 51 permit a light beam 64 to pass therethrough, and the transverse apertures 52 are internally threaded for engagement with external threads of alignment screws 54.

Received within at least one of the central bores 50 of the U-shaped member 44 is a light beam positioner 90 for directing the light beam from the sample holder body 14 to the sample X held by the sample support member 16. In a preferred embodiment, the light beam positioner 90 is a mirror assembly 56 including a mirror support 58, a mirror 60 provided at a distal end thereof, and a mirror adjustment screw 62 provided at a proximal end thereof opposite the mirror 60. In a preferred embodiment, two mirror assemblies 56 are provided for reflecting a light beam 64 back to the external alignment part 12, as will be discussed in further detail below.

The mirror 60 can be glued or otherwise fixed at the end of the mirror support 58. The mirror support 58 has a lateral width slightly smaller than the diameter of the leg bore 50 to allow for some adjustment of the position of the mirror support within the bore, as will be discussed in further detail below.

As used herein, the term "mirror" is intended to encompass any type of reflection or light deflection device. For example, as shown in FIG. 8, the mirror 60 may include a flat mirror 60a, a reflection prism 60b, a parabolic mirror 60c, an arrangement 60d of flat mirrors 60a and convex lenses 61, an arrangement 60e of reflection prisms 60b and convex lenses 61, or an arrangement 60f of optical fibers 63 optically connected to reflection prisms 60b and including convex lenses 61, among others.

In a preferred use, a mirror assembly 56 is provided in at least one of the bores 50 of the U-shaped member 44 for deflecting a light beam 64 traveling from the external alignment part 12 through the sample holder body 14 into the sample support member 16. The mirror 60 of the mirror assembly 56 is positioned to deflect the light beam 64 at a ninety (90) degree angle. The position of the mirror 60 is accurately adjusted by the adjustment screws 54. The alignment screws 54 are externally threaded and include a socket 55 for receiving a tool, such as an Allen key, for rotating the screw. Rotation of the screws 54 causes the screws to engage the outer surface of the mirror support 58 thereby urging the support member in a desired direction within the leg axial bore 50.

Preferably, there are four alignment screws 54 provided on the U-shaped member 44. Two alignment screws 54a are preferably provided for adjustment of the mirror assembly in the X-direction, as shown in FIG. 7, and two alignment screws 54b are provided for adjusting the mirror assembly in the Y-direction (perpendicular to the plane of the paper) as shown in FIG. 7. The mirror assembly 56 is further adjusted in the Z-direction by rotation of the mirror adjustment screw portion 62 of the mirror assembly. Thus, the mirror assembly 56 can be precisely adjusted to accurately receive the light beam 64 traveling along the central bore 50 of U-shaped member 44 and deflect the light beam ninety (90) degrees to exit through the transverse light beam aperture 51 to intersect with a sample X supported between the legs 46 of the U-shaped member 44.

Figure 7A:
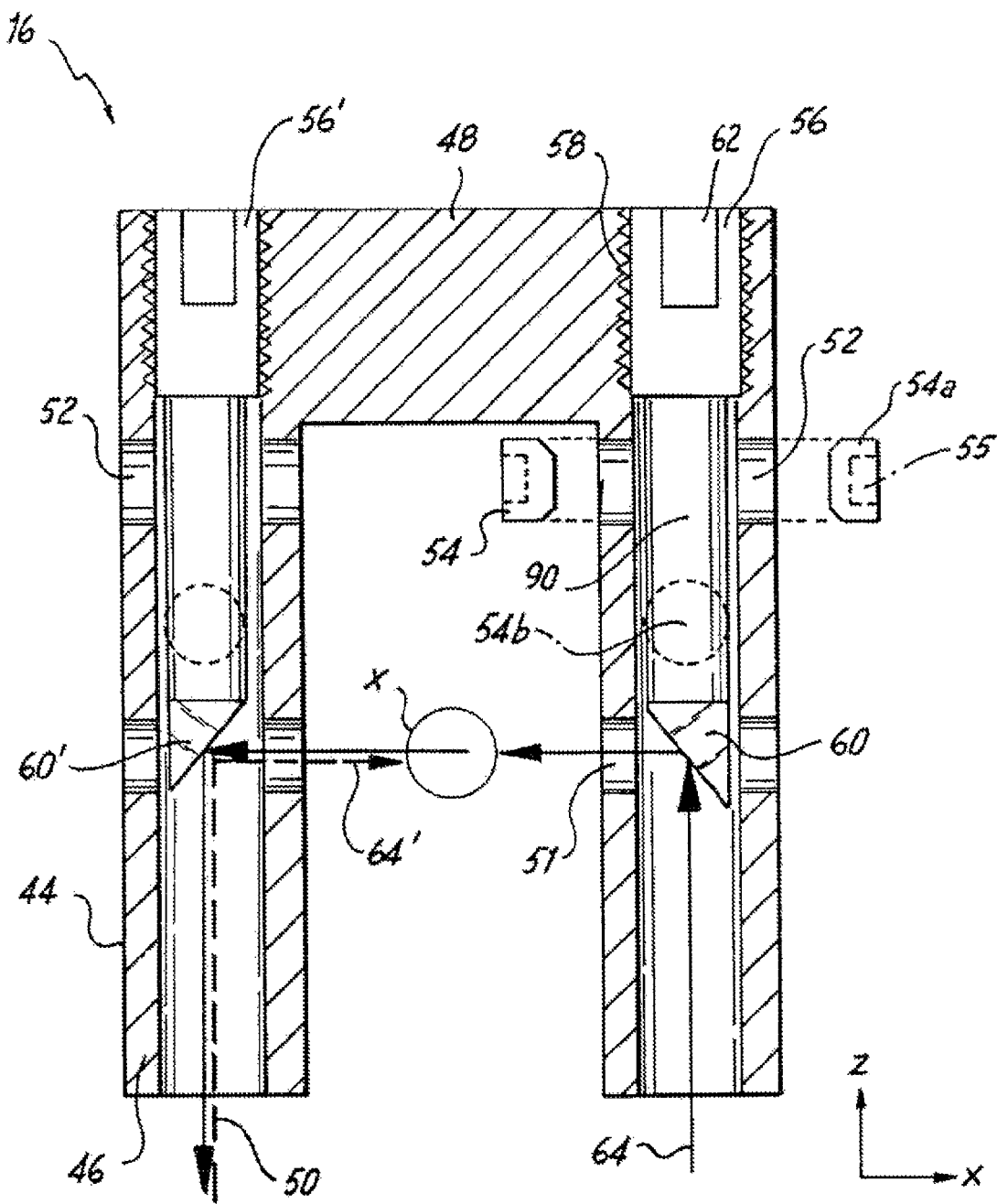
FIG. 7a is a cross-sectional view of the sample support member shown in FIG. 7 with two mirror assemblies.
Figure 8A:
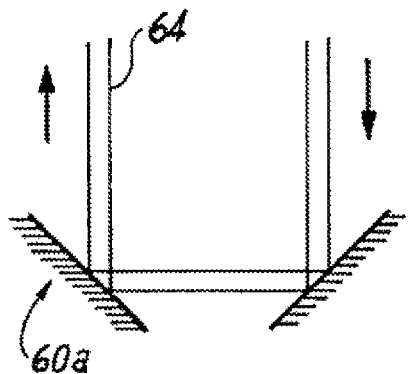
FIGS. 8a-8f show schematic representations of alternative embodiments of the mirror arrangement contained within the tip of the sample holder.
Figure 8B:
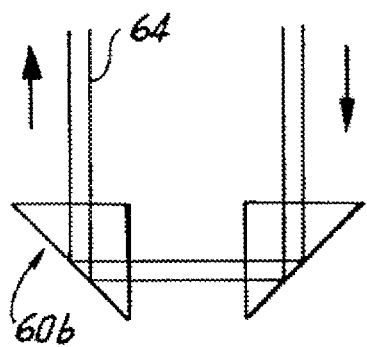
Figure 8C:
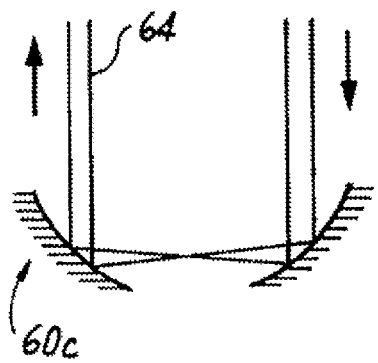
Figure 8D:
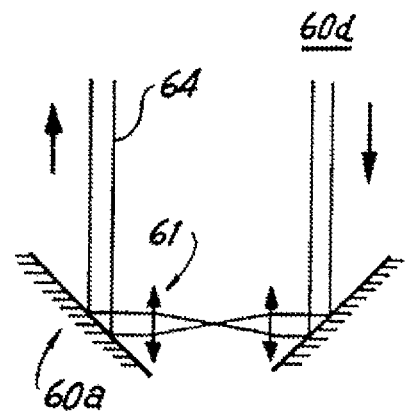
Figure 8E:
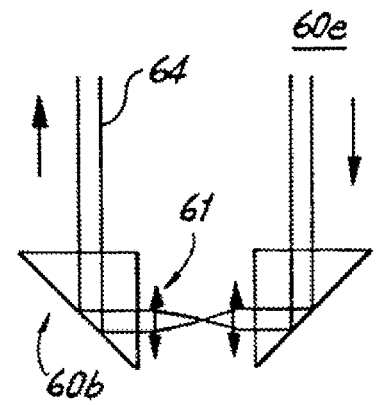
Figure 8F:
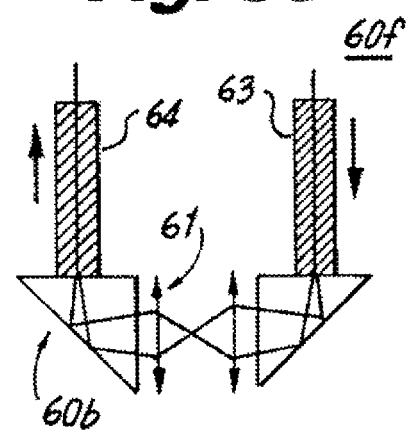

As mentioned above, a second mirror assembly 56' is preferably provided in the opposite leg 46 of the U-shaped member 44, as shown in FIG. 7a. The second mirror assembly 56' can be utilized to receive the reflected light beam 64 from the first mirror assembly 56 and reflect the light beam an additional ninety (90) degrees so that the light beam returns up the sample body holder body 14 back to the external alignment part 12 for light detection purposes as discussed above.

Thus, the first aligning mirror 60 is positioned in the sample support member 16 so that it bends the beam 64 at the angle of ninety (90) degrees and traverses the area where the sample X will be fixed and continues to the area where a second aligning mirror 60' will be positioned. The second aligning mirror 60' is positioned in the sample support member 16 and aligned so that the beam 64 is deflected for another ninety (90) degrees and is aligned with the axis of the sample holder body 14 and falls on the mirror 33 in the external alignment part 12. Alignment of both the first and second mirrors is achieved using the five adjustment screws 54 and 62.

As described above, the beam 64 is deflected another ninety (90) degrees, within the external alignment part 12, and directed toward the lens collector system 32. Using the micropositioning device 36, the lens collector system 32 is aligned with the light beam 64 so that the collected light beam can be transported using the optical fiber 34 to a spectrometer (not shown).

Alternatively, the second mirror assembly 56' can be provided in the U-shaped member to direct a second light beam 64' traveling parallel to the first light beam 64 so that two light beams can be directed to the sample X supported between the legs 46 of the U-shaped member 44. In this case, two separate light beams originate in the external alignment part 12 and traverse the sample holder body 14, freely or via optical fibers, to be received by the mirrors 60 of the sample holder support member 16.

Figure 9:
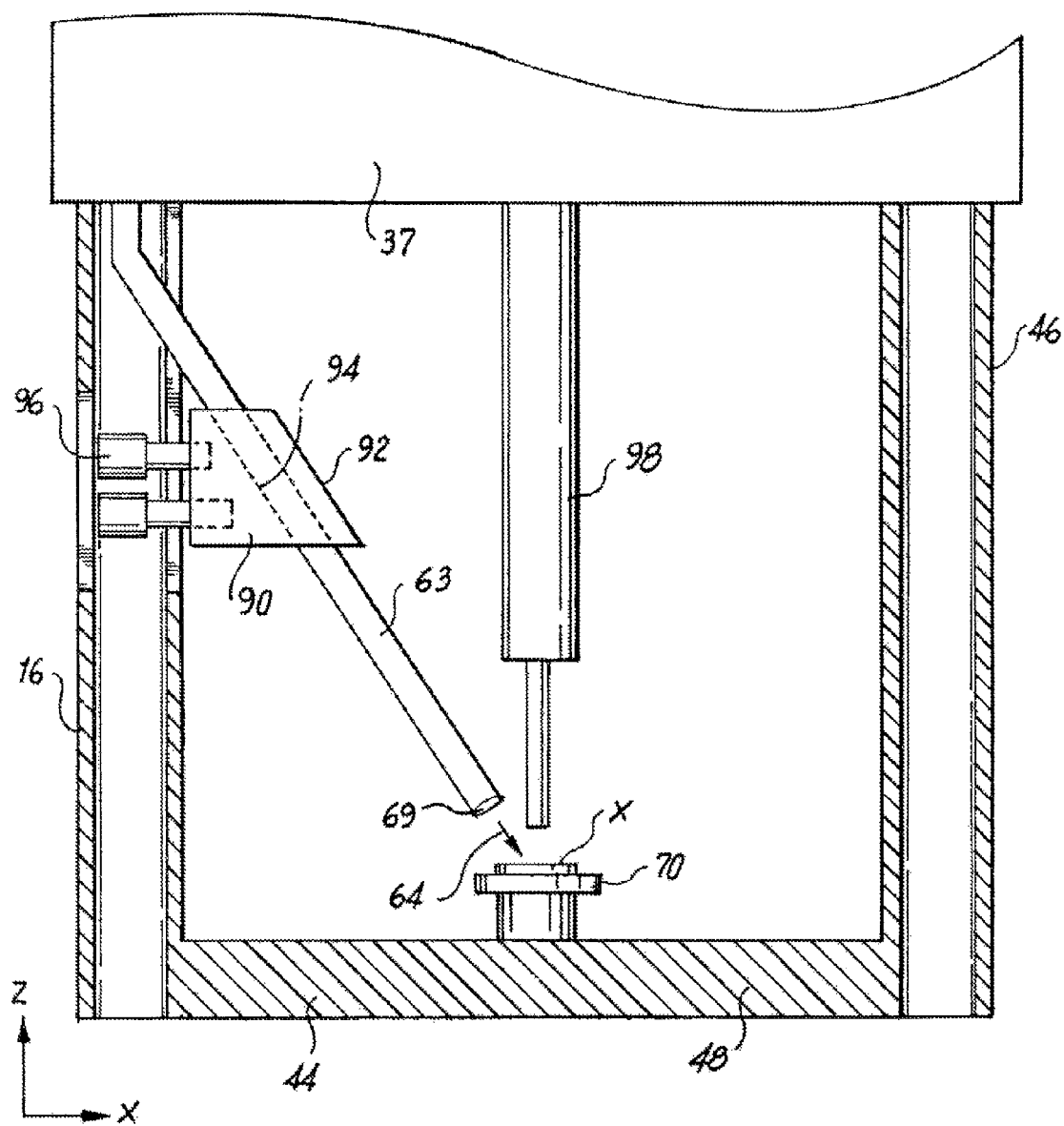
FIG. 9 is a partial cross-sectional view of the sample holder support member modified according to an alternative embodiment of the present invention.

In an alternative embodiment, as shown in FIG. 9, the light positioner 90 can take the form of an adjustable fiber optic support platform 92. This embodiment is particularly suitable where an optical fiber 63 is used to convey the light beam 64 to the sample X, shown here being focused through an optional lens 69. The fiber optic support platform 92 can be formed with a groove 94 to receive the optic fiber 63 exiting the sample holder body probe portion 37 and can include one or more adjustment screws 96 threadably connected thereto to permit adjustment of the platform 92 in the x, y and z directions. In this embodiment, the distance the light beam 64 travels to meet the sample is significantly reduced.

The TEM sample holder 10 of the present invention can be used in combination with other research techniques commonly known in the field. For example, FIG. 9 also shows the sample support member 16 being used in conjunction with a thermal probe 98, typically used where heat dependent measurements are needed.

Similarly, sample holder 10 of the present invention can also be adapted to provide scanning tunneling microscope (STM) capabilities in combination with optical measurement capabilities. Thus, as shown in FIG. 6, the sample holder body 14 can be designed to support a conventional STM tip 80 with the associated electrical wiring being contained within the probe portion 37 of the sample holder body. Thus, the holder can be adapted to integrate an optical system with a piezomechanical STM system in a single TEM sample holder. As a result, the user can utilize the STM setup for positioning or for contacting the sample, and the optical part to illuminate the sample and/or collect the light emitted/scattered from the sample.

Figure 10:
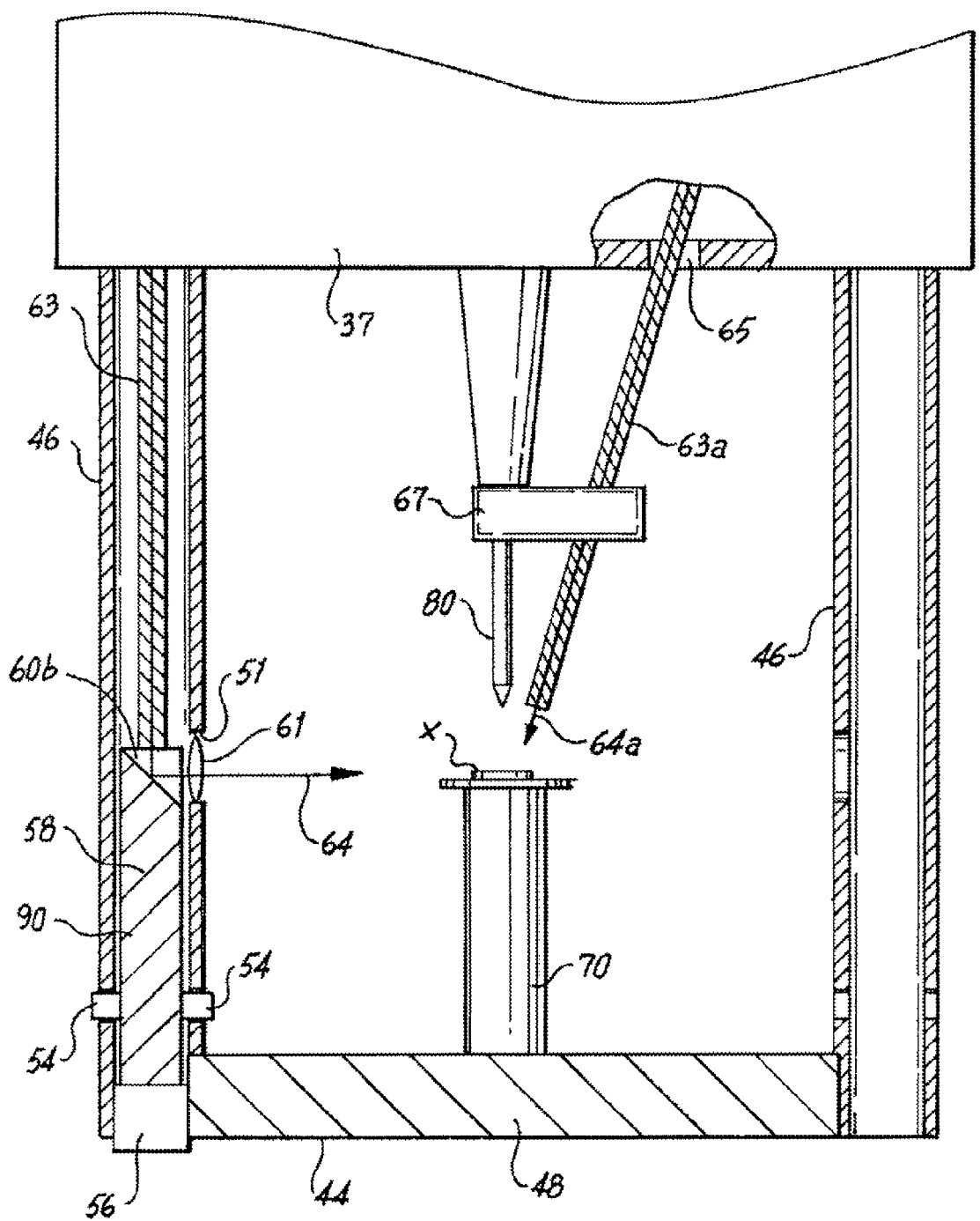
FIG. 10 is a partial cross-sectional view of the sample holder support member modified according to another alternative embodiment of the present invention.

FIG. 10 shows a further embodiment of the present invention, wherein a STM tip 80 is used in conjunction with an optical fiber light beam delivery system. In particular, the left-hand side (as shown in FIG. 10) of the sample holder tip 44 includes an optical fiber 63 optically connected to a reflection prism 60b and further includes a convex lens 61 fixed in the light aperture 51 of the leg 46. Thus, a light beam 64 is directed to a sample X held in a sample holder structure 70, as described above. The right-hand side (as shown in FIG. 10) of the sample holder tip 44, however, has been modified to allow a second optical fiber 63a to deliver a second light beam 64 directly to the sample X. Such modification can involve removing the optical fiber 63a from the right leg 46 of the sample holder tip and feeding the optical fiber through an optical fiber aperture 65 at the distal end of the sample holder body probe portion 37, which allows the optical fiber to be positioned adjacent the STM tip 80 to deliver a light beam 64a directly to the sample X.

The optical fiber 63a can be positioned so that the light beam 64a can be delivered to the sample X at any desired angle. The optical fiber 63a can be fixed to the STM tip via a clamp or coupling 67, which can be used as a positioning stage for the optical fiber, thus enabling the user to illuminate various parts of the sample successively without removing the stage from the microscope. Also, in a reverse set-up, the optical fiber 63a can be positioned across various parts of the light emitting sample and collect locally emitted light.

Figure 11A:
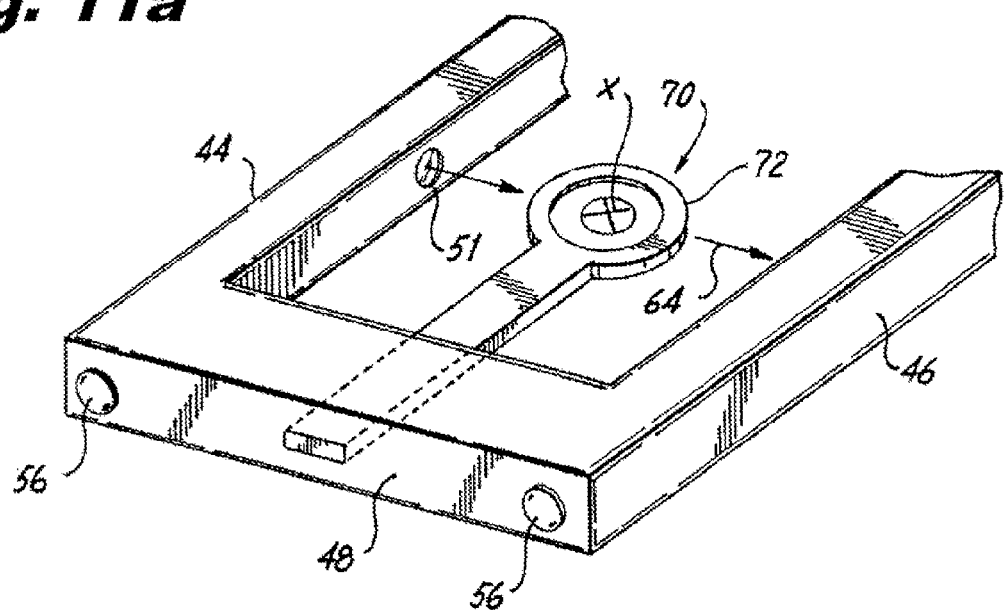
FIGS. 11a and 11b are top perspective views of alternative embodiments of the sample support structure of the present invention.
Figure 11B:
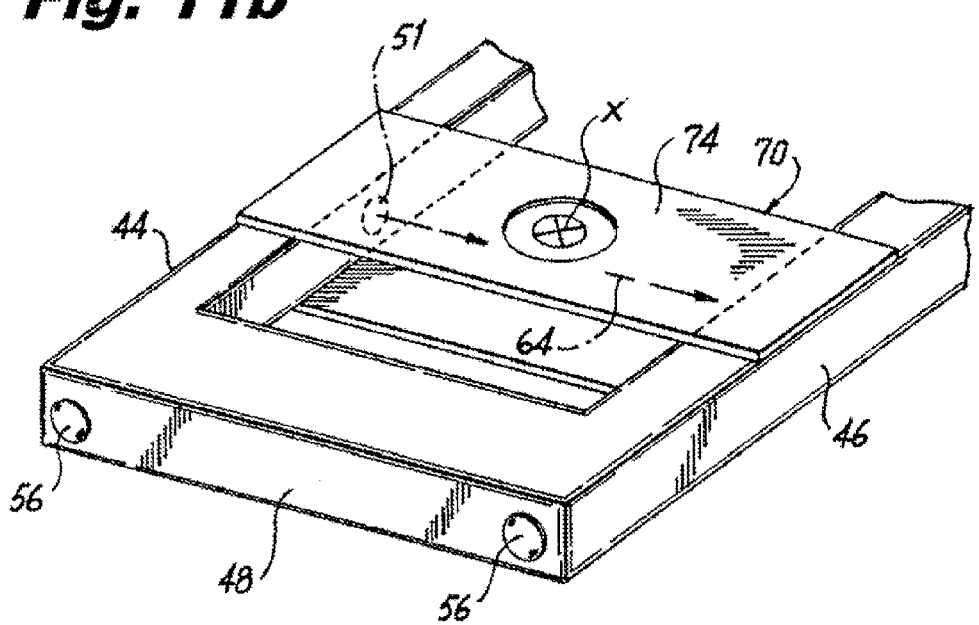

Referring now to FIGS. 11a and 11b, the structure 70 for actually holding or supporting the sample X can take various forms. For example, as shown in FIG. 9a, an arm member 72 can be provided on the cross member 48 of the U-shaped body 44, which extends between and parallel with the legs 46 of the body to support a sample X between the light beam windows 51. Alternatively, as shown in FIG. 9b, a bracket assembly 74 can be removably attached to and extend between the parallel legs 46 of the U-shaped member 44 to position the sample X adjacent the light beam windows 51. In another alternative embodiment, a simple hole can be formed through the end of the cross member 48 and a wire having a sample fixed thereto can be inserted and secured to the throughhole. In any event, any conventional means can be implemented to retain the sample X within the sample retaining structure 70.

Thus, in some embodiments the invention provides a specific type of TEM sample holder, wherein two deflection systems can be implemented along the optical path of a light beam. Depending on the particular setup, the beam can be only deflected or deflected and focused. Each deflection system is independent and can consist of: 1) a deflection surface (mirror or prism); 2) a focusing device (optional); and 3) alignment screws.

As a result of the present invention, a sample holder is provided, which, for the first time, integrates independent measurement systems in one setup that enables simultaneous measurement of geometric, electric, electronic and optical properties of materials in a very small space.

Although the illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention. For example, it is conceivable that the STM tip can be replaced with a cooling system for changing the local temperature at the sample position, as shown in FIG. 9.

Various changes to the foregoing described and shown structures will now be evident to those skilled in the art. Accordingly, the particularly disclosed scope of the invention is set forth in the following claims.

The invention claimed is:

1. A sample holder for holding a sample to be evaluated, the sample holder comprising:
   an external alignment part including a housing and a light source interface assembly attached to one end of said housing, said light source interface assembly being adapted to engage a light source and direct a light beam from said light source in a predetermined beam direction into an interior of said housing;
   a sample holder body in optical communication with said housing of said external alignment part, said sample holder body defining an internal conduit for conveying the light beam; and a sample support member disposed at a distal end of said sample holder body opposite said external alignment part for holding a sample to be analyzed, said sample support member including a first light beam positioner for directing the light beam between said sample holder body and a sample held by said sample support member.

2. A sample holder according to claim 1, wherein said sample support member further comprises a second light beam positioner, said first light beam positioner delivering the light beam from said sample holder body to the sample held by the sample support member and said second light beam positioner collecting the light beam from the sample and delivering the light beam to said sample holder body.

3. A sample holder according to claim 1, wherein said first light positioner is a light deflection assembly for deflecting the light beam to and/or from the sample held by said sample support member.

4. A sample holder according to claim 3, wherein said light deflection assembly comprises:
a mirror support;
a mirror disposed at a distal end of said mirror support;
a first adjustment mechanism provided at a proximal end of said mirror support opposite said mirror for positioning said mirror in a first direction;
a second adjustment mechanism engaged with said mirror support for positioning said mirror in a second direction; and
a third adjustment mechanism engaged with said mirror support for positioning said mirror in a third direction.

5. A sample holder according to claim 1, wherein said sample support member comprises a U-shaped body including parallel legs joined by a cross member, said legs being fixed to said sample holder body and at least one of said legs having an axial bore communicating with said internal conduit of said sample holder body for conveying the light beam between said sample holder body and said sample.

6. A sample holder according to claim 5, wherein said at least one leg further includes a transverse window communicating with said axial bore in said leg, and wherein said first light positioner is a light deflection assembly disposed in said axial bore of said leg adjacent said window for deflecting the light beam between said leg axial bore and the sample through said window.

7. A sample holder according to claim 1, further comprising at least one optical fiber disposed within said internal conduit of said sample holder body for conveying the light beam.

8. A sample holder according to claim 7, wherein said light beam positioner comprises a support platform, said support platform retaining said optical fiber and being adjustable with respect to said sample support member for directing the light beam to and/or from said sample.

9. A sample support member for holding a sample to be analyzed at the end of a sample probe inserted within a housing of an analytical device, the sample support member comprising:
a first light beam positioner for directing a light beam between the sample and the sample probe; and
a sample retaining structure for holding said sample in a path of said light beam.

10. A sample support member according to claim 9, wherein said sample support member further comprises a second light beam positioner, said first light beam positioner delivering the light beam from said sample probe to the sample held by the sample support member and said second light beam positioner collecting the light beam from the sample and delivering the light beam to the sample probe.

11. A sample support member according to claim 9, wherein said first light positioner is a light deflection assembly for deflecting the light beam to and/or from the sample held by said sample support member.

12. A sample support member according to claim 11, wherein said light deflection assembly comprises:
a mirror support;
a mirror disposed at a distal end of said mirror support;
a first adjustment mechanism provided at a proximal end of said mirror support opposite said mirror for positioning said mirror in a first direction;
a second adjustment mechanism engaged with said mirror support for positioning said mirror in a second direction; and
a third adjustment mechanism engaged with said mirror support for positioning said mirror in a third direction.

13. A sample support member according to claim 11, wherein said sample support member comprises a U-shaped body including parallel legs joined by a cross member, said legs being fixed to said sample probe and at least one of said legs having an axial bore communicating with an internal conduit of said sample probe for conveying the light beam between the sample probe and said sample.

14. A sample support member according to claim 13, wherein said at least one leg further includes a transverse window communicating with said axial bore in said leg, and wherein said first light positioner is a light deflection assembly disposed in said axial bore of said leg adjacent said window for deflecting the light beam between said leg axial bore and the sample through said window.

15. A method for providing light to a sample held by a sample holder, the method comprising the steps of:
receiving a light beam from a light source with an external alignment part of said sample holder;
directing said light beam with said external alignment part into a sample holder body of said sample holder;
conveying the light beam through an internal conduit of said sample holder body of the sample holder;
holding the sample at a distal end of said sample holder body with a sample support member fixed to said distal end of said sample holder body; and
directing the light beam between the sample holder body and the sample with a first light beam positioner of said sample support member.

16. A method as defined in claim 15, wherein the light beam travels from the sample holder body and is deflected by the first light positioner toward the sample.

17. A method as defined in claim 16, wherein the light beam further travels from the sample and is deflected back to the sample holder body by a second light positioner of the sample support member.

18. A method as defined in claim 15, wherein the light beam travels from the sample and is deflected by the first light positioner into the sample holder body.

19. A method as defined in claim 15, further comprising the step of directing a second light beam between the sample holder body and the sample with a second light positioner of the sample support member.

20. A method as defined in claim 15, wherein the light beam is conveyed through the sample holder body via an optic fiber disposed within the internal conduit of the sample holder body.

* * * * *